United States Patent
Xu

(10) Patent No.: US 9,559,054 B2
(45) Date of Patent: Jan. 31, 2017

(54) REPAIRING LINE STRUCTURE AND CIRCUIT REPAIRING METHOD USING SAME

(71) Applicant: SHENZHEN CHINA STAR OPTOELECTRONICS TECHNOLOGY CO., LTD., Shenzhen, Guangdong (CN)

(72) Inventor: Liang Xu, Guangdong (CN)

(73) Assignee: SHENZEHN CHINA STAR OPTOELECTRONICS TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 14/111,798

(22) PCT Filed: Jun. 30, 2013

(86) PCT No.: PCT/CN2013/078544
§ 371 (c)(1),
(2) Date: Oct. 15, 2013

(87) PCT Pub. No.: WO2014/205856
PCT Pub. Date: Dec. 31, 2014

(65) Prior Publication Data
US 2016/0118330 A1    Apr. 28, 2016

(30) Foreign Application Priority Data
Jun. 27, 2013   (CN) .......................... 2013 1 0261423

(51) Int. Cl.
*H01L 29/06*   (2006.01)
*H01L 23/525*   (2006.01)
(Continued)

(52) U.S. Cl.
CPC ....... *H01L 23/525* (2013.01); *G02F 1/136259* (2013.01); *H01L 21/485* (2013.01);
(Continued)

(58) Field of Classification Search
CPC .. H01L 22/22; H01L 21/485; H01L 21/76868; H01L 21/768; H01L 21/48; H01L 21/76894; H01L 2251/568; H01L 27/12
See application file for complete search history.

(56) References Cited

U.S. PATENT DOCUMENTS 4,894,690 A  *  1/1990  Okabe ................... G02F 1/1368
                                                          257/209
2001/0035920 A1   11/2001  Choi
(Continued)

FOREIGN PATENT DOCUMENTS

CN        1570742 A      1/2005
CN        1877844 A      12/2006
(Continued)

OTHER PUBLICATIONS

Peng LiJuan, The International Searching Authority written comments, Apr. 2014, CN.

*Primary Examiner* — Cuong B Nguyen

(57) ABSTRACT

The present invention discloses a repairing line structure for repairing a breakage at a crossing point of electric wires extending along different directions on a thin film transistor panel. The repairing line structure includes a repair line extending from a same side of the electric wire where the breakage is defined and connecting opposite ends of the breakage and an amorphous silicon protection pattern. The repairing line traverses the other electric wire crossing with the electric wire where the breakage is defined. The amor-
(Continued)

phous silicon protection pattern is located between the repairing line and the electric wire traversed by the repairing line.

5 Claims, 4 Drawing Sheets

(51) Int. Cl.
    *G02F 1/1362*     (2006.01)
    *H01L 27/12*     (2006.01)
    *H01L 21/48*     (2006.01)
    *H01L 21/768*     (2006.01)

(52) U.S. Cl.
    CPC ...... *H01L 21/76894* (2013.01); *H01L 27/124* (2013.01); *H01L 27/1259* (2013.01); *G02F 2001/136263* (2013.01); *H01L 21/76892* (2013.01); *H01L 2924/0002* (2013.01)

(56) References Cited

U.S. PATENT DOCUMENTS

| | | | | |
|---|---|---|---|---|
| 2005/0174505 A1* | 8/2005 | Lai | .................... | G02F 1/136259 349/54 |
| 2011/0194041 A1* | 8/2011 | Cheng | ............... | G02F 1/136259 349/38 |

FOREIGN PATENT DOCUMENTS

| | | | |
|---|---|---|---|
| CN | 1916745 | A | 2/2007 |
| CN | 101086564 | A | 12/2007 |
| CN | 101216644 | A | 7/2008 |
| CN | 102914888 | A | 2/2013 |

\* cited by examiner

REPAIRING LINE STRUCTURE AND CIRCUIT REPAIRING METHOD USING SAME

FIELD OF THE INVENTION

The invention relates to display technologies, and particularly, to a repairing line and a circuit repairing method used in a display panel.

BACKGROUND OF THE INVENTION

A current display panel is usually driven by an active thin film transistors matrix. Each pixel of the display panel is connected to a gate line and a data line to operate a display action. There are millions of pixels on the display panel, with a need of tens of thousands of gate lines and data lines. However, if there is only a few of lines in so many the gate lines and the data lines are broken, the whole display panel becomes a degraded product, which dramatically decreases a yield rate of the display panel and increase the cost of the manufacture of the display panel.

Therefore, a repairing line structure and a circuit repairing method which can solve the above-mentioned problem needs to be provided.

SUMMARY OF THE INVENTION

To solve the above-mentioned problem, the present invention provides a repairing line structure for repairing a breakage at a crossing point of electric wires extending along different directions on a thin film transistor panel. The thin film transistor panel includes a number of gate lines extending along a first direction, a number of data lines extending along a second direction, a number of thin film transistors correspondingly located at crossing points of the gate lines and the data lines, and a number of pixel electrodes correspondingly connected to the thin film transistors. The repairing line includes a repairing line extending from a same side of the electric wire where the breakage is defined and connecting opposite ends of the breakage and an amorphous silicon protection pattern. The repairing line traverses the other electric wire crossing the electric wire where the breakage is defined, and the amorphous silicon protection pattern is located between the repairing line and the electric wire traversed by the repairing line.

Wherein, a part of pixel electrode of the other pixel overlapped with the repairing line is cut off from the other part of pixel electrode of the corresponding pixel.

Wherein, the amorphous silicon protection pattern is extended to the adjacent pixel electrodes overlapped by the repairing line.

Wherein, the amorphous silicon protection pattern only overlaps on the electric wire where the breakage is defined.

Wherein, the repairing line is made of a conductive metal deposited on the thin film transistor substrate by a laser chemical vapor deposition. Two ends of the repairing line are fused to connect with the data line by a laser beam.

A circuit repairing method for repairing a breakage at a crossing point of electric wires extending along different directions on a thin film transistor panel. The thin film transistor panel includes a number of gate lines extending along a first direction, a number of data lines extending along a second direction, a number of thin film transistors correspondingly located at crossing points of the gate lines and the data lines, and a plurality of pixel electrodes correspondingly connected to the thin film transistors. The circuit repairing method includes the steps: forming an amorphous silicon protection pattern at a position on the gate line away from the crossing point of the gate line and the data line a predetermined distance at a same time of exposing an amorphous silicon; growing a repairing line correspondingly at two opposite sides of the breakage defined on the data line and connecting the repairing lines with each other; cutting off a part of the pixel electrodes traversed by the repairing lines from the other part of the pixel electrodes; fusing the ends of the repairing lines on the data line by a laser beam to make the repairing lines electrically connect with the data line.

Wherein, the part of the pixel electrode traversed by the repairing line is cut off from the other part of the pixel electrode by a laser beam.

Wherein, the repairing lines are made of tungsten.

Wherein, the amorphous silicon protection pattern is extended to the adjacent pixel electrodes overlapped by the repairing line.

Wherein, the amorphous silicon protection pattern only overlaps on the electric wire where the breakage is defined.

Wherein, the repairing line is made of a conductive metal deposited on the thin film transistor substrate by a laser chemical vapor deposition.

The repairing line structure and the circuit repairing method provided by the present invention preforms the amorphous silicon protection pattern on the gate line to prevent the repairing line from connecting with the gate line by a high energy laser beam when the repairing line traverses the gate line. Otherwise, the amorphous silicon protection pattern is formed together with the amorphous silicon layer of thin film transistor and no additional step is added.

BRIEF DESCRIPTION OF THE DRAWINGS

In order to illustrate technical schemes of the present invention or the prior art more clearly, the following section briefly introduces drawings used to describe the embodiments and prior art. Obviously, the drawing in the following descriptions just is some embodiments of the present invention. The ordinary person in the related art can acquire the other drawings according to these drawings without offering creative effort.

DETAILED DESCRIPTION OF PREFERRED EMBODIMENTS

The following sections offer a clear, complete description of the present invention in combination with the embodiments and accompanying drawings. Obviously, the embodiments described herein are only a part of, but not all of the embodiments of the present invention. In view of the embodiments described herein, any other embodiment obtained by the person skilled in the field without offering creative effort is included in a scope claimed by the present invention.

Figure 1:
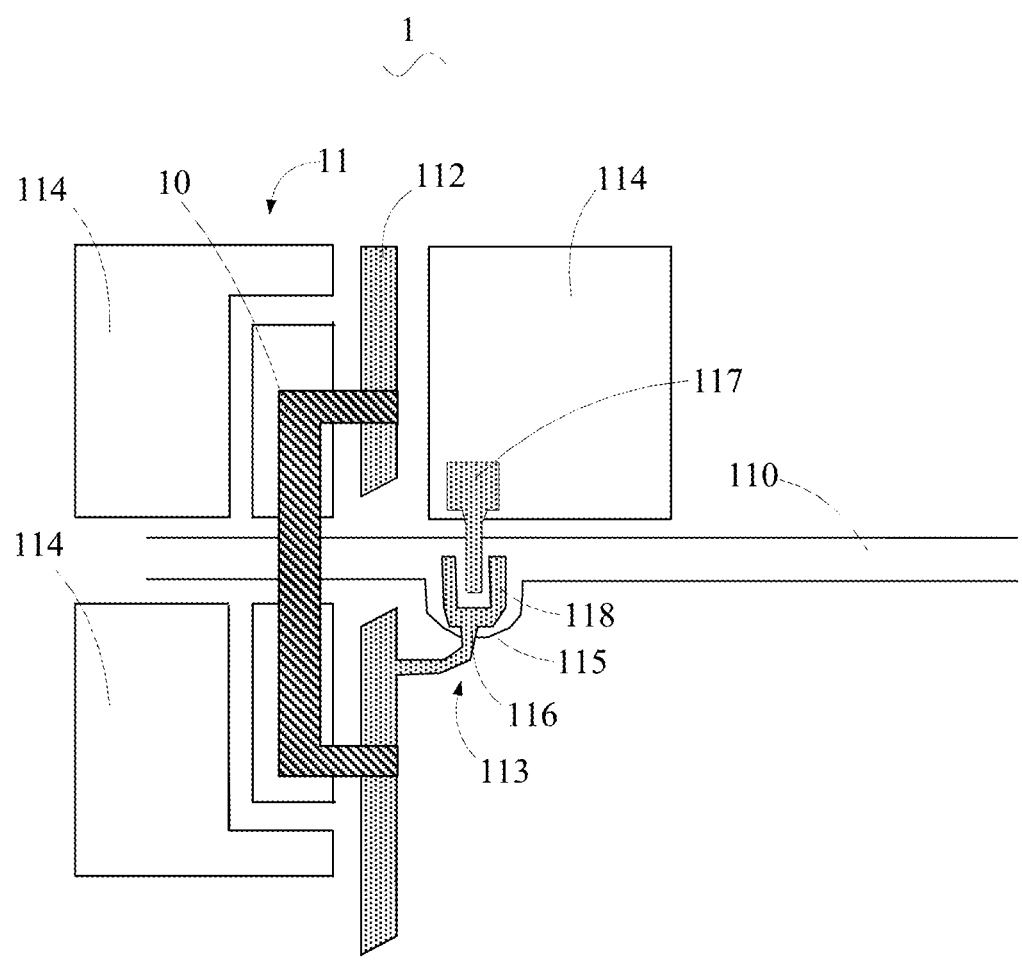
FIG. 1 is a schematic structural view of a repairing line structure in accordance with a first embodiment of the present invention.
Figure 2:
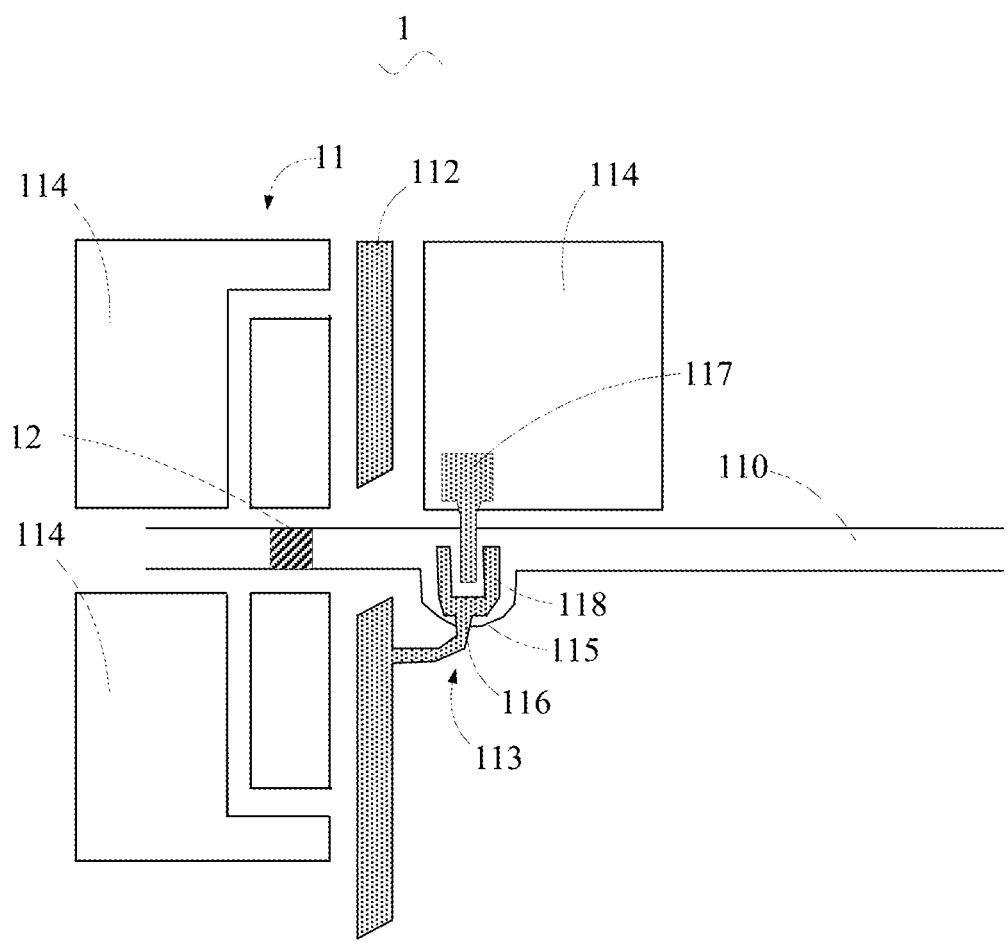
FIG. 2 is a protection pattern of the repairing line structure of FIG. 1.

Referring to FIGS. 1 and 2, a first embodiment of the present invention provides a repairing line structure 1 used to repair a breakage at a crossing point of electric wires extending along different directions on a thin film transistor (TFT) panel 11. The repairing line structure 1 includes a repair line 10 extending from a same side of the electric wire where the breakage is defined and connecting opposite ends of the breakage and an amorphous silicon protection pattern 12. The repairing line 10 traverses the other electric wire crossing the electric wire where the breakage is defined. The amorphous silicon protection pattern 12 is located between the repairing line 10 and the electric wire traversed by the repairing line. In this embodiment, the electric wires are gate lines 110 or data lines 112 of the TFT panel 11.

The TFT panel 11 includes a number of gate lines 110 extending along a first direction, a number of data lines 112 extending along a second direction, a number of TFTs 113 located at crossing points of the gate lines 110 and the data lines 112, and a pixel electrode 114 connected to the TFT 113. The TFT 113 includes a gate electrode 115 connected to the gate line 110, a source electrode 116 connected to the data line 112, a drain electrode 117 connected to the pixel electrode 114, and a channel layer 118 connecting the source electrode 116 and the drain electrode 117. When the gate line 110 selects the TFT 113 of one of the pixels via the gate electrode 115, data signal from the data line 112 is transmitted to the pixel electrode 114 to display via the channel layer 118. In this embodiment, the gate lines 110 are perpendicular to the data lines 112. The breakage is defined at a crossing point of the data lines 112 and the gate line 110.

Two ends of the repairing line 10 correspondingly extend from two opposite sides and connect with each other by traversing the gate line 110. A part of pixel electrode 114 of the other pixel overlapped with the repairing line 10 is cut off from the other part of pixel electrode 114 of the corresponding pixel to avoid from being affected by display signal transmitted by the repairing line 10.

The repairing line 10 is made of a conductive metal, such as tungsten, deposited on a substrate by a laser chemical vapor deposition. Two ends of the repairing line 10 are fused to connect with the data line 112 by a laser beam. The part of pixel electrode 114 overlapped with the repairing line 10 is cut off from the other part of the pixel electrode 114 by the laser beam.

The amorphous silicon protection pattern 12 is made of amorphous silicon. The amorphous silicon protection pattern 12 is formed in an amorphous silicon process and does not needs an additional process. In this embodiment, the amorphous silicon protection pattern 12 correspondingly extends along two opposite sides of a direction perpendicular to the gate line 110 to two adjacent pixel electrodes 114 and overlaps with a part of the pixel electrodes 114. The channel layer 18 is also made of the amorphous silicon. Therefore, the amorphous silicon protection pattern 12 can formed with the channel layer at a same time. Because the amorphous silicon protection pattern 12 avoids the gate line 110 from a damage of the laser beam, the amorphous silicon protection pattern 12 can prevent a short between the gate line 110 and the data line 112.

Figure 3:
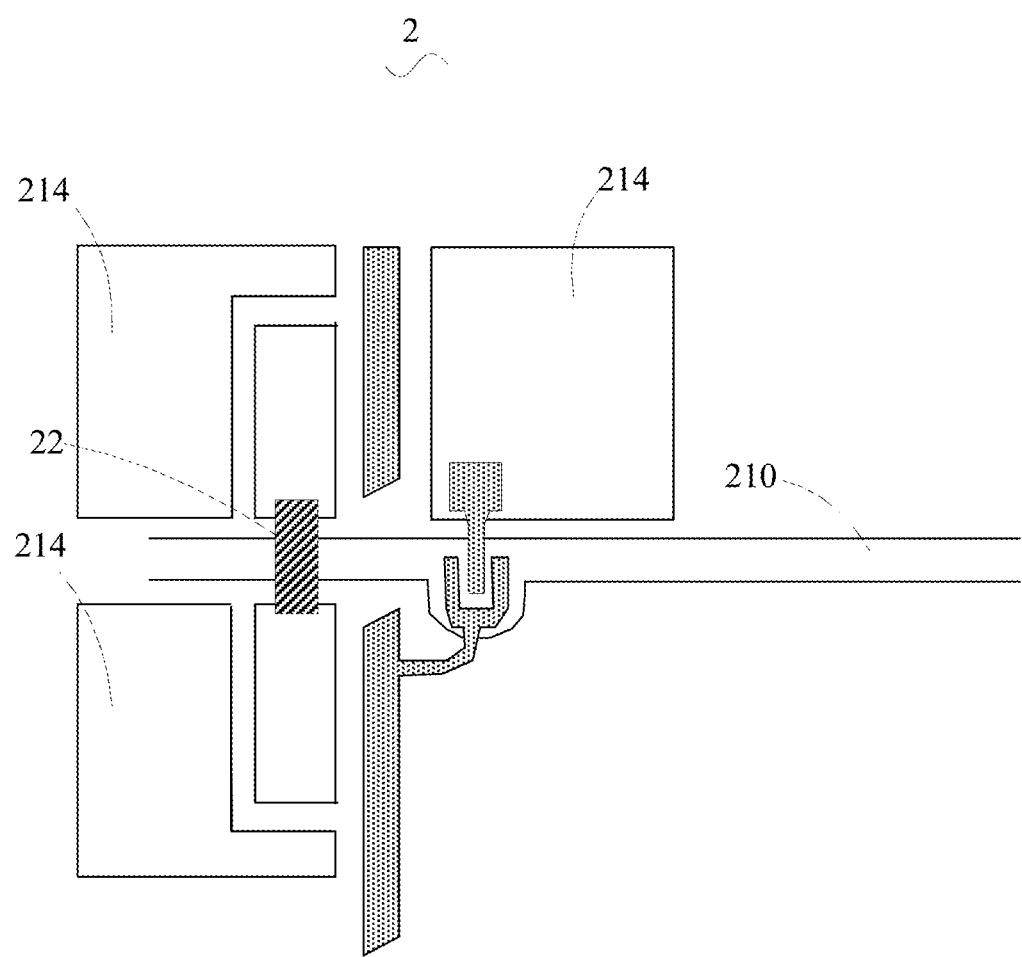
FIG. 3 is a schematic structural view of a repairing line structure in accordance with a second embodiment of the present invention.

Referring to FIG. 3, a second embodiment of the present invention provides a repairing line structure similar to the repairing line structure of the first embodiment, a difference therebetween is: two opposite sides of the amorphous silicon protection pattern along the direction perpendicular to the gate line 210 does not overlap with two adjacent pixel electrode.

Figure 4:
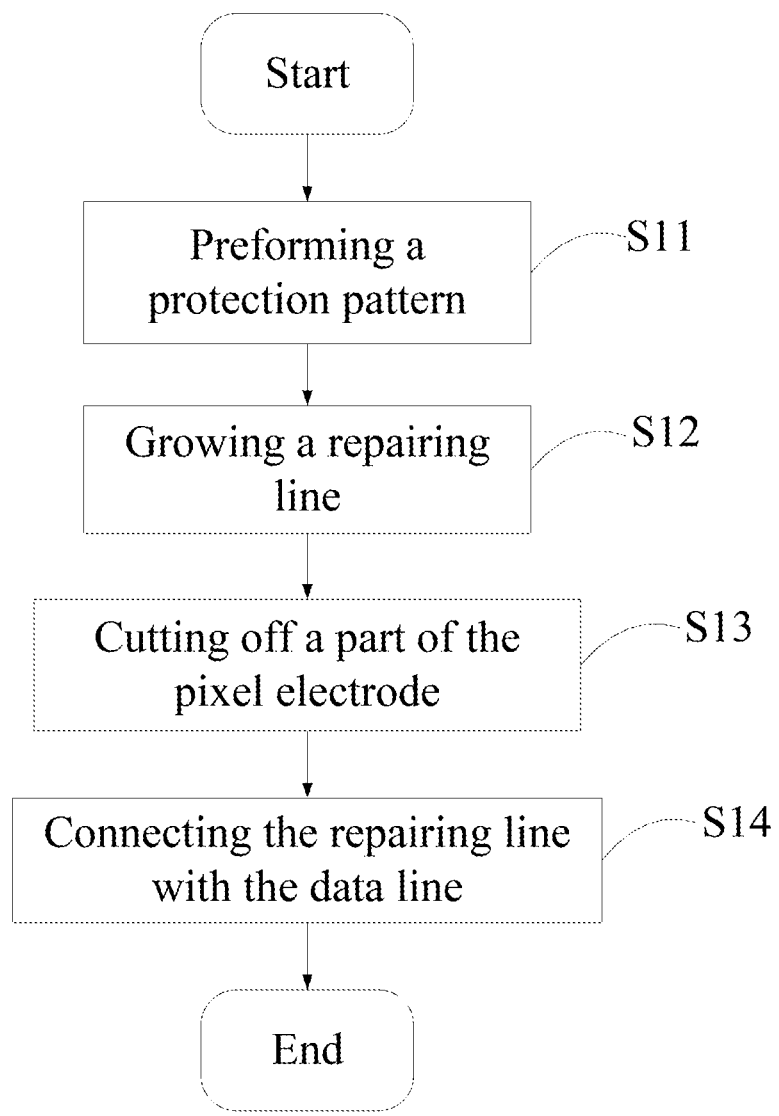
FIG. 4 is a flow chart of steps of a circuit repairing method in accordance with an embodiment of the present invention.

Referring to FIG. 4, a circuit repairing method provided in an embodiment of the present invention. The circuit repairing method is used to repair a breakage at a crossing point of electric wires extending along different directions on the TFT panel 11. The TFT panel 11 includes a number of gate lines 110 extending along a first direction, a data line 112 extending along a second direction, a TFT 113 located at a crossing point of the gate lines 110 and the data lines 112, and a pixel electrode 114 connected to the TFT 113. The circuit repairing method includes following steps:

Step S11, preforming the amorphous silicon protection pattern 12. Referring to FIG. 2, at the same time of exposing the amorphous silicon layer, to form the amorphous silicon protection pattern 12 at a position on the gate line 110 away from the crossing point of the gate line 110 and the data line 112 a predetermined distance. The amorphous silicon protection pattern 12 extends along the direction perpendicular to the gate line 110 to two adjacent pixel electrodes 114 and overlaps with a part of the pixel electrodes 114.

Also referring to FIG. 3, it is understood that, in the other alternative embodiment, the amorphous silicon protection pattern 12 does not extend to the pixel electrodes 114 which are adjacent to the gate line 110.

Step S12, growing the repairing line 10, to grow the repairing lines 10 along the direction perpendicular to the data line 112 at two opposite sides of the breakage on the data line 112 by use of the laser chemical vapor deposition. The repairing lines at two sides of the breakage first grow along the direction perpendicular to the data line 112 until to a position aligned to the amorphous silicon protection pattern 12, and then turn to grow along the direction perpendicular to the gate line 110 unit connect with each other. Therefore, the repairing line 10 overlaps with the amorphous silicon protection pattern 12 when traverses the gate line 110. The repairing line 10 is made of conductive metal. In this embodiment, the repairing line 10 is made of tungsten.

Step S13, cutting off a part of the pixel electrodes 114, the repairing lines 10 correspondingly passes over two pixel electrodes 114 adjacent to the gate line 110. In order to prevent the pixel electrodes 114 from being affected by data signal transmitted by the repairing lines 10, a part of the pixel electrode 14 overlapping with the repairing line 10 is cut off from the other part of the pixel electrode 114 by a laser beam.

Step S14, connecting the repairing line 10 with the data line 112, to fuse the ends of the repairing lines 10 on the data line 112 by a laser beam to make tungsten electrically connects with the data line 112.

The circuit repairing method provided by the present invention presets the amorphous silicon protection pattern 12 on the gate line 110 to prevent the repairing line from connecting with the gate line 110 by a high energy laser beam when the repairing line 10 traverses the gate line 10. Otherwise, the amorphous silicon protection pattern 12 is formed together with the amorphous silicon layer of TFT 113 and no additional step is added.

What is said above are only preferred examples of present invention, not intended to limit the present invention, any modifications, equivalent substitutions and improvements etc. made within the spirit and principle of the present invention, should be included in the protection range of the present invention.

What is claimed is:

1. A repairing line structure for repairing a breakage at a crossing point of electric wires extending along different directions on a thin fin transistor panel, the thin film transistor panel comprising a plurality of gate lines extending along a first direction, a plurality of data lines extending along a second direction, a plurality of thin film transistors correspondingly located at crossing points of the gate lines and the data lines, and a plurality of pixel electrodes correspondingly connected to the thin film transistors, the repairing line structure comprising:
- a repairing line extending from a same side of the electric wire where the breakage is defined and connecting opposite ends of the breakage; and
- an amorphous silicon protection pattern;
- wherein the repairing line traverses first electric wire crossing the electric wire where the breakage is defined, and the amorphous silicon protection pattern is located between the repairing line and the first electric wire traversed by the repairing line, wherein a part of pixel electrode of a pixel overlapped with the repairing line is cut off from another part of pixel electrode of the pixel.

2. The repairing line structure of claim 1, wherein the amorphous silicon protection pattern is extended to adjacent pixel electrodes that are overlapped by the repairing line.

3. The repairing line structure of claim 1, wherein the amorphous silicon protection pattern only overlaps on the electric wire where the breakage is defined.

4. The repairing line structure of claim 1, wherein the repairing line is made of a conductive metal deposited on the thin film transistor substrate by a laser chemical vapor deposition, two ends of the repairing line are fused to connect with the data line by a laser beam.

5. A repairing line structure for repairing a breakage at a crossing point of electric wires extending along different directions on a thin film transistor panel, the thin film transistor panel comprising a plurality of gate tines extending along a first direction, a plurality of data lines extending along a second direction, a plurality of thin film transistors correspondingly located at crossing points of the gate lines and the data lines, and a plurality of pixel electrodes correspondingly connected to the thin film transistors, the repairing line structure comprising:
- a repairing line extending from a same side of the electric wire where the breakage is defined and connecting opposite ends of the breakage; and
- an amorphous silicon protection pattern;
- wherein the repairing line traverses the other electric wire crossing the electric wire where the breakage is defined, and the amorphous silicon protection pattern is located between the repairing line and the electric wire traversed by the repairing line, wherein the amorphous silicon protection pattern is extended to adjacent pixel electrodes that are overlapped by the repairing line.

* * * * *